United States Patent
Li et al.

(10) Patent No.: US 12,185,646 B2
(45) Date of Patent: Dec. 31, 2024

(54) PHASE CHANGE MEMORY HAVING GRADUAL RESET

(71) Applicant: International Business Machines Corporation, Armonk, NY (US)

(72) Inventors: Ning Li, White Plains, NY (US); Wanki Kim, Chappaqua, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/082,189

(22) Filed: Dec. 15, 2022

(65) Prior Publication Data

US 2023/0123642 A1 Apr. 20, 2023

Related U.S. Application Data

(62) Division of application No. 16/817,912, filed on Mar. 13, 2020, now abandoned.

(51) Int. Cl.
*H10N 70/00* (2023.01)

(52) U.S. Cl.
CPC ....... *H10N 70/8616* (2023.02); *H10N 70/021* (2023.02); *H10N 70/826* (2023.02); *H10N 70/8413* (2023.02)

(58) Field of Classification Search
CPC ............. H10N 70/231; H10N 70/8828; H10N 70/826; H10N 70/8616; H10N 70/823;

(Continued)

(56) References Cited

U.S. PATENT DOCUMENTS

| 5,825,046 A | 10/1998 | Czubatyj et al. |
| 10,454,025 B1 | 10/2019 | Cheng |

(Continued)

FOREIGN PATENT DOCUMENTS

| CN | 102543170 B | 10/2014 |
| JP | 2008530790 A | 8/2008 |

(Continued)

OTHER PUBLICATIONS

International Search Report dated May 17, 2021 issued in PCT/IB2021/050860, 8 pages.

(Continued)

*Primary Examiner* — David Chen
(74) *Attorney, Agent, or Firm* — Scully, Scott, Murphy & Presser, P.C.; Daniel P. Morris, Esq.

(57) ABSTRACT

A phase change memory (PCM) structure configured for performing a gradual reset operation includes first and second electrodes and a phase change material layer disposed between the first and second electrodes. The PCM structure further includes a thermal insulation layer disposed on at least sidewalls of the first and second electrodes and phase change material layer. The thermal insulation layer is configured to provide non-uniform heating of the phase change material layer. Optionally, the thermal insulation layer may be formed as an air gap. The PCM structure may be configured having the first and second electrodes aligned in a vertical or a lateral arrangement.

16 Claims, 9 Drawing Sheets

(58) Field of Classification Search
CPC ............. H10N 70/8413; H10N 70/881; H10N 70/021; H10N 70/861; H10N 70/061
USPC ... 257/2, 3, 4, 5, E27.004, E29.17, E45.001, 257/E45.002; 438/102, 109, 122, 382, 438/400
See application file for complete search history.

(56) References Cited

U.S. PATENT DOCUMENTS

| | | |
|---|---|---|
| 2003/0194865 A1 | 10/2003 | Gilton |
| 2006/0175596 A1 | 8/2006 | Happ et al. |
| 2006/0175597 A1 | 8/2006 | Happ |
| 2006/0220071 A1 | 10/2006 | Kang et al. |
| 2007/0075347 A1 | 4/2007 | Lai et al. |
| 2007/0096162 A1 | 5/2007 | Happ et al. |
| 2007/0131922 A1* | 6/2007 | Lung .................. H10N 70/026 257/E29.17 |
| 2007/0285962 A1* | 12/2007 | Yen .................... G11C 13/0004 257/E21.602 |
| 2008/0042167 A1* | 2/2008 | Chen .................. H10N 70/884 |
| 2008/0265237 A1* | 10/2008 | Goux .................. H10N 70/063 257/3 |
| 2009/0101883 A1 | 4/2009 | Lai et al. |
| 2010/0059729 A1 | 3/2010 | Hudgens |
| 2010/0108977 A1* | 5/2010 | Yoon .................. H10N 70/8828 257/E21.585 |
| 2010/0295010 A1* | 11/2010 | Tio Castro ........... H10N 70/231 257/E45.001 |
| 2011/0037042 A1* | 2/2011 | Breitwisch ............ H10B 63/30 257/E47.001 |
| 2011/0069528 A1* | 3/2011 | Gammel ............ G11C 13/0069 326/8 |
| 2011/0103139 A1 | 5/2011 | Kau et al. |
| 2011/0149371 A1* | 6/2011 | Liu ....................... G02F 1/0147 359/288 |
| 2011/0198554 A1* | 8/2011 | Iijima .................. H10N 70/063 257/2 |
| 2011/0227027 A1 | 9/2011 | Czubatyj et al. |
| 2011/0272660 A1 | 11/2011 | Wells |
| 2013/0001505 A1* | 1/2013 | Delhougne ........ H10N 70/8828 257/E45.001 |
| 2013/0300509 A1 | 11/2013 | Kim et al. |
| 2013/0322167 A1* | 12/2013 | Krebs .................. H10N 70/253 365/163 |
| 2014/0198553 A1 | 7/2014 | Lung |
| 2016/0104840 A1 | 4/2016 | Cook et al. |
| 2018/0138401 A1 | 5/2018 | Ando et al. |
| 2020/0052203 A1* | 2/2020 | Trinh .................. H10N 70/801 |
| 2020/0144405 A1* | 5/2020 | Yun .................. H01L 29/66969 |
| 2021/0118503 A1* | 4/2021 | Wu ....................... G11C 13/004 |
| 2021/0288250 A1 | 9/2021 | Li et al. |

FOREIGN PATENT DOCUMENTS

| | | |
|---|---|---|
| JP | 2009524210 A | 6/2009 |
| JP | 2017537470 A | 12/2017 |
| JP | 2018524698 A | 8/2018 |

OTHER PUBLICATIONS

Raoux, S., et al., 2014. "Phase Change Materials and Phase Change Memory", Materials Research Society, Aug. 2014, pp. 703-710, vol. 39.

Thermtest™ Instruments, Materials Thermal Properties Database, Thermtest.com, 2021, 4 pages.

lst of IBM Patents or Patent Applications Treated as Related, filed herewith, 2 pages.

Examination Report dated Jul. 7, 2023 received in a corresponding foreign application, 6 pages.

English-language translation of a Notice of Reasons for Refusal dated Jul. 18, 2024 received in a corresponding foreign application, namely Japanese Patent Application No. 2022-549384, 8 pages.

* cited by examiner

PHASE CHANGE MEMORY HAVING GRADUAL RESET

BACKGROUND

The present invention relates generally to the electrical, electronic and computer arts, and, more particularly, to phase change memory.

Phase change memory (PCM) is a form of random-access memory (RAM) that stores data by altering a state of the matter from which the device is fabricated. At the heart of a PCM cell is a small region of a semiconductor alloy (e.g., chalcogenide) that can be changed rapidly between an ordered, crystalline phase having lower electrical resistance and a disordered, amorphous phase having much higher electrical resistance. This change in resistance between the crystalline and amorphous phases, and thus a logical state of the PCM cell, is easily discernible. Because no electrical power is required to maintain either phase of the material, phase-change memory is non-volatile.

A state (i.e., phase) of the phase change material forming the PCM cell is set (i.e., written) as a function of an amplitude and duration of an applied electrical pulse that heats the material. When heated to a temperature just above its melting point (e.g., over about 600 degrees Celsius), the semiconductor alloy's energized atoms move around into random arrangements. Turning off the applied electrical pulse gradually (e.g., over about 10 nanoseconds (ns)) provides sufficient time for the atoms to reorganize themselves back into the well-ordered crystalline phase they prefer; this is often referred to as set state. Alternatively, freezing the atoms into the disordered, amorphous phase requires abruptly halting the applied electrical pulse; this is often referred to as a reset state.

SUMMARY

The present invention, as manifested in one or more embodiments thereof, beneficially provides a phase change memory (PCM) structure, and methods for fabricating a PCM structure, which provides a gradual reset functionality. In one or more embodiments, this gradual reset functionality is achieved using a novel device geometry and applied bias signal. Specifically, aspects of the invention, as manifested in one or more embodiments, are directed to a PCM structure including phase change material sandwiched between two electrodes in a disk form factor having a gap configured to allow non-uniform heating of the phase change material. This novel PCM geometry, in conjunction with an applied bias signal having prescribed amplitude and duration characteristics, advantageously enables the PCM structure to achieve a gradual reset functionality.

In accordance with an embodiment of the invention, a PCM structure configured for performing a gradual reset operation includes first and second electrodes and a phase change material layer disposed between the first and second electrodes. The PCM structure further includes a thermal insulation layer disposed on at least sidewalls of the first and second electrodes and phase change material layer. The thermal insulation layer is configured to provide non-uniform heating of the phase change material layer. Optionally, the thermal insulation layer may be formed as an air gap. The PCM structure may be configured having the first and second electrodes aligned in a vertical or a lateral arrangement.

In accordance with an embodiment of the invention, a method of forming a PCM structure configured for performing a gradual reset operation is provided. The method includes: forming first and second electrodes; forming a phase change material layer between the first and second electrodes; and forming a thermal insulation layer on at least sidewalls of the first and second electrodes and phase change material layer, the thermal insulation layer configured to provide non-uniform heating of the phase change material layer.

In accordance with another embodiment of the invention, a method of performing a gradual reset operation in a PCM structure is provided, the PCM structure including first and second electrodes, a phase change material layer disposed between the first and second electrodes, and a thermal insulation layer disposed on at least sidewalls of the first and second electrodes and phase change material layer. The method includes applying a first reset pulse between the first and second electrodes, the first reset pulse having an amplitude that is greater than a crystalline phase change material switching threshold voltage and less than an amphorous phase change material switching threshold voltage, for a prescribed duration to cause a temperature of the phase change material layer to rise until a temperature in a center portion of the phase change material layer exceeds a phase change material melting temperature, resulting in the center portion of the phase change material layer switching to a high-resistance amorphous state. The method further includes applying at least one subsequent reset pulse between the first and second electrodes, the subsequent reset pulse having an amplitude and duration that is the same as the first reset pulse, causing a temperature of the phase change material layer to rise until a temperature in a portion of the phase change material layer adjacent to the center portion exceeds a phase change material melting temperature, resulting in the portion of the phase change material layer adjacent to the center portion switching to a high-resistance amorphous state while the center portion of the phase change material layer remains in the high-resistance amorphous state.

As may be used herein, "facilitating" an action includes performing the action, making the action easier, helping to carry out the action, or causing the action to be performed. Thus, by way of example only and without limitation, in the context of a semiconductor fabrication methodology, steps performed by one entity might facilitate an action carried out by another entity to cause or aid the desired action(s) to be performed. For the avoidance of doubt, where an actor facilitates an action by other than performing the action, the action is nevertheless performed by some entity or combination of entities.

Techniques of the present invention can provide substantial beneficial technical effects. By way of example only and without limitation, PCM structures and/or methods of fabricating a PCM structure according to embodiments of the invention may provide one or more of the following advantages:

- gradual reset functionality;
- enables a single PCM cell to be used for both set and reset operations;
- in the context of a memory array application, achieves increased density of the overall memory array;
- increases the speed of an artificial intelligence (AI) chip in which the PCM cell is used;
- reduces power consumption of the AI chip in which the PCM cell is used.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Principles of the present invention, as manifested in one or more embodiments thereof, will be described herein in the context of an illustrative phase change memory (PCM) structure, and methods for fabricating such PCM structures, having a gradual reset functionality. This gradual reset functionality, in one or more embodiments, is achieved using a novel device geometry and applied bias signal profile. It is to be appreciated, however, that the invention is not limited to the specific structures and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

As previously stated, phase change materials exist in an ordered, crystalline phase (or multiple crystalline phases) having lower electrical resistance and a disordered, amorphous phase having higher electrical resistance. These phase change materials can be rapidly and repeatedly switched between their crystalline and amorphous phases, typically induced by heating through applied electrical and/or optical pulses.

Figure 1:
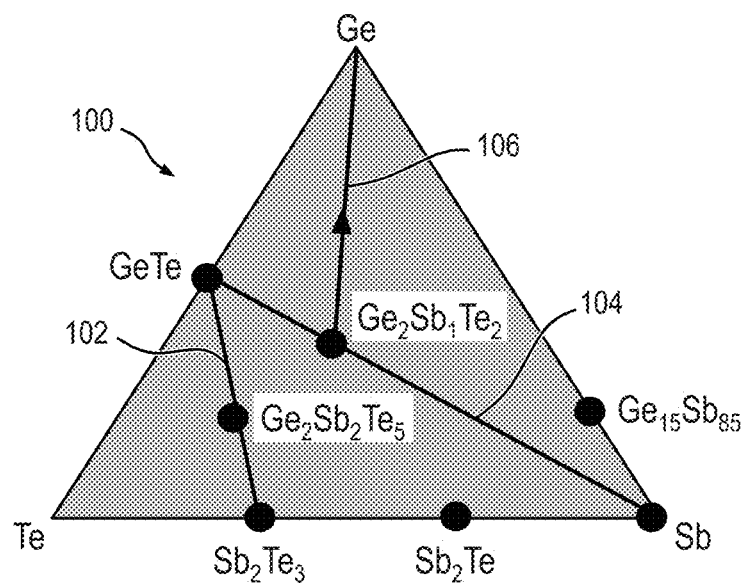
FIG. 1 is a phase diagram of a germanium-antimony-tellurium (Ge—Sb-Te) ternary alloy system, with some known phase change alloys indicated.

Many suitable phase change materials comprise a class of compounds called chalcogenides. Chalcogenides generally exhibit strong optical and electrical contrast, fast crystallization and high crystallization temperatures (e.g., several hundred degrees Celsius). One such chalcogenide commonly used as a phase change material is the compound germanium-antimony-tellurium ($Ge_xSb_yTe_z$ or GST). FIG. 1 is a phase diagram 100 of a Ge—Sb-Te ternary alloy system, with some known phase change alloys indicated. With reference to FIG. 1, alloys along a pseudo-binary line 102 between $Sb_2Te_3$ and GeTe with compositions $(GeTe)_m(Sb_2Te_3)_n$, including the alloy $Ge_2Sb_2Te_5$, are used in modern PCM devices. For faster switching applications, PCM devices using undoped and slightly Ge-doped Sb phase change materials with a composition of $Ge_{15}Sb_{85}$ have also been fabricated. Another set of phase change materials along a pseudo-binary line 104 between GeTe and Sb has also been studied for use in PCM devices. Starting with the alloy $Ge_2Sb_1Te_2$ on line 104, increasing the percentage of Ge in the alloy (as represented by the arrow along line 106) leads to phase change materials having higher thermal stability of the amorphous phase, which are well-suited for high-temperature PCM applications.

Figure 2:
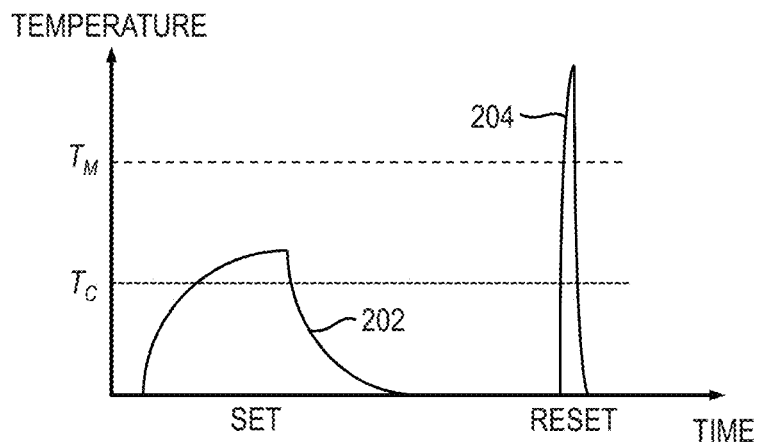
FIG. 2 is a graph depicting exemplary temperature profiles that can be used to switch the state of the phase change material in a standard PCM cell.

As previously explained, the state of the phase change material forming the PCM cell is traditionally set (i.e., written) as a function of the amplitude and duration of an applied electrical pulse that heats the material. With reference to FIG. 2, a graph is shown depicting exemplary temperature profiles used to switch the state of the phase change material in a standard PCM cell. Specifically, at a certain threshold voltage of the PCM cell, a resistance of the cell drops suddenly and a large current flows through the cell which heats the phase change material above its crystallization temperature, Tc, for a sufficiently long time to crystallize. Gradually turning off the applied current pulse provides sufficient time for the atoms in the phase change material to reorganize themselves back into their well-ordered crystalline phase. This set operation is represented by temperature profile 202. In the crystalline state, the resistance of the PCM cell is low. A larger amplitude, shorter duration current pulse applied to the PCM cell heats the phase change material above its melting temperature, $T_M$. By abruptly removing the current pulse, the phase change material is melt-quenched and returns to its amorphous, high resistance state. This reset operation is represented by temperature profile 204. Thus, traditional PCM cells can have a gradual set but an abrupt reset.

Aspects of the present invention, as manifested in one or more embodiments thereof, advantageously provide a PCM structure that, in addition to having a gradual set characteristic, provides a gradual reset functionality. This gradual reset functionality is achieved, in one or more embodiments, using a novel device geometry and applied bias signal profile.

Although the overall fabrication method and the structures formed thereby as described herein are entirely novel, certain individual processing steps required to implement the method may incorporate conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications. It is emphasized that while some individual processing steps are set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such integrated circuit devices may not be explicitly shown in a given figure to facilitate a clearer description. This does not imply that the semiconductor layer(s) not explicitly shown are omitted in the actual integrated circuit device.

Figure 3A:
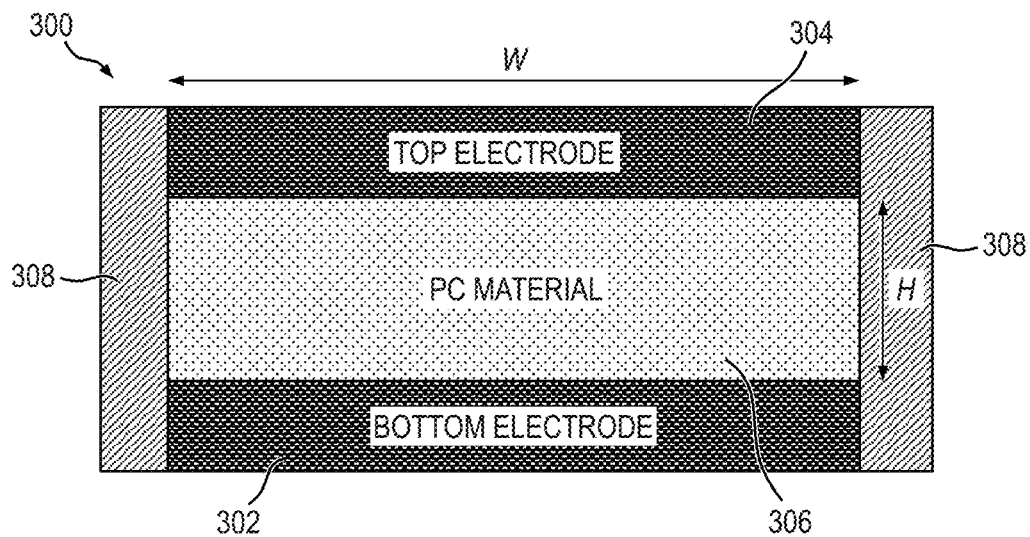
FIGS. 3A and 3B are cross-sectional and top views, respectively, depicting an exemplary vertical PCM cell, according to an embodiment of the present invention.
Figure 3B:
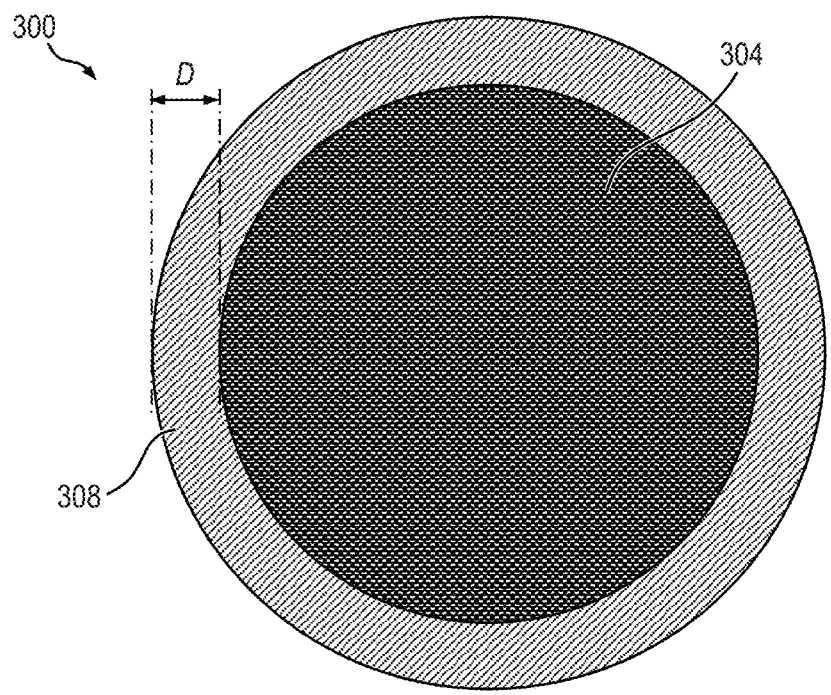

By way of example only and without limitation, FIGS. 3A and 3B are cross-sectional and top views, respectively, depicting an exemplary vertical PCM cell 300, according to an embodiment of the invention. In this illustrative embodiment, the PCM cell 300 is configured having a flat, circular (i.e., discoid or disk-shaped) form factor. More particularly, the PCM cell 300 includes a first electrode 302, which may be a bottom electrode, and a second electrode 304, which may be a top electrode. The PCM cell 300 further includes a phase change (PC) material layer 306 sandwiched between the top and bottom electrodes. That is, the PC material layer 306 is disposed on an upper surface of the bottom electrode 302, which essentially serves as a substrate to the PC material layer, and the top electrode 304 is disposed on an upper surface of the PC material layer 306. The first and second electrodes 302, 304 and PC material layer 306 can be formed, in one or more embodiments, using a standard deposition process, as will be known by those skilled in the art.

In one or more embodiments, when a bias signal (e.g., bias voltage) is applied between the top and bottom electrodes 304, 302, a current will flow through the PC material layer 306, from the electrode having a higher voltage potential to the electrode having a lower voltage potential, relative to one another. This current flowing through the PC material layer 306 will cause local heating to occur in a portion of the PC material layer. When the temperature of the phase change material reaches a prescribed threshold level, a change of state of the phase change material will, as previously explained. Since the electrodes 302, 304 are arranged in a vertical relationship relative to one another, the induced current will flow vertically through the PC material layer. Thus, the PCM cell 300 may be referred to herein as a vertical PCM device.

Beneficially, the bottom and top electrodes 302, 304 and the PC material layer 306, in this illustrative embodiment, are concentrically surrounded by a thermal insulation layer 308. The thermal insulation layer 308 functions to thermally isolate the PCM cell 300 from adjacent structures, for example, other PCM cells in a memory device. By preventing heat from escaping to surrounding structures, the thermal insulation layer 308 advantageously allows non-uniform heating of the phase change material. The thermal insulation layer 308 can also help reduce the amount of heat, and therefore applied bias signal, required to switch the crystalline state of the PCM cell 300.

As shown in FIG. 3A, a width, W, of the exemplary PCM cell 300 is preferably much greater than a height, H, of the PCM cell. In one or more embodiments, the PCM cell 300 is configured having a height in a range from about 5 nanometers (nm) to about 50 nm, and having a width in a range from about 100 nm to about 1 micron (μm), so that a ratio of width-to-height of the PCM cell 300 is about 20:1. With reference to FIG. 3B, a thickness, D, of the thermal insulation layer 308, in one or more embodiments, is in a range from about 10 nm to about 300 nm. Although it is generally desirable to minimize the thickness of the thermal insulation layer 308 to increase integration density, it is to be appreciated that embodiments of the invention are not limited to any specific dimensions of the PCM cell 300.

The material used to form the bottom and top electrodes 302, 304, in one or more embodiments, comprises a material having increased thermal resistance, such as, but not limited to, silicon, germanium, carbon, tungsten, Manganin (an alloy containing copper, manganese and nickel), etc., although embodiments of the invention are not limited to any specific material(s) for forming the bottom and top electrodes. Moreover, the bottom and top electrodes 302, 304 need not be formed of the same material. In one or more embodiments, a thermal conductance of the first and second electrodes 302, 304 is preferably less than about 100 watts per meter-kelvin (W/m·K). The thermal insulation layer 308 preferably comprises a material having sufficient thermal insulation properties, such as materials having a thermal conductivity that is less than about 0.1 W/m·K. Suitable materials for forming the thermal insulation layer 308 include, but are not limited to, porous oxides (e.g., silicon dioxide) or air.

Figure 3C:
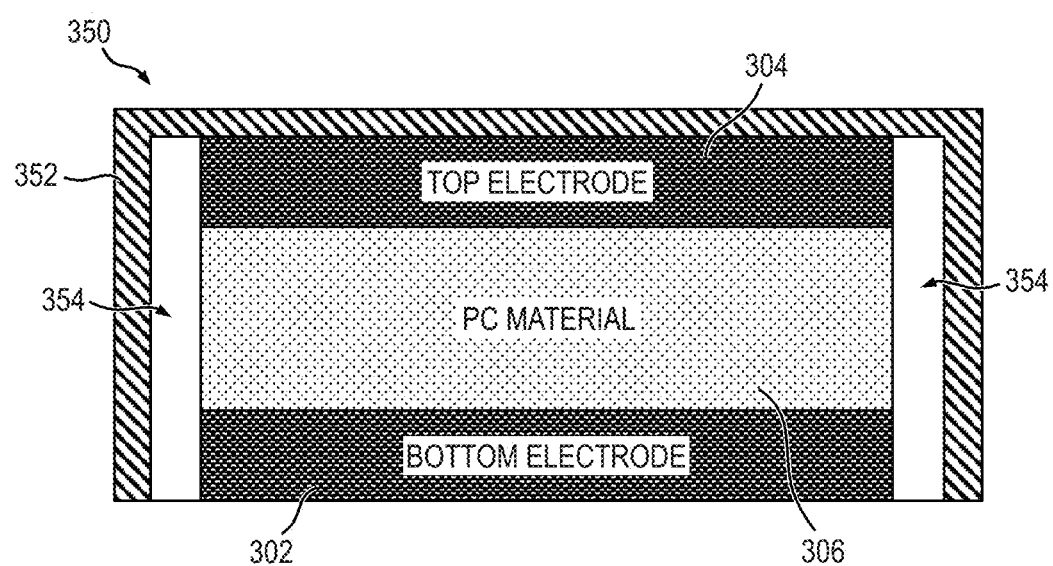
FIG. 3C is a cross-sectional view depicting at least a portion of an exemplary vertical PCM cell having an air gap as a thermal insulation layer, according to another embodiment of the present invention.

Alternatively, FIG. 3C is a cross-sectional view depicting at least a portion of an illustrative vertical PCM cell 350 having an air gap as a thermal insulation layer, according to another embodiment of the invention. With reference to FIG. 3C, in the illustrative PCM structure 350, the thermal insulation layer is formed as an air gap, since the properties of air are suitable for use as a thermal insulator. In one or more embodiments, when forming the thermal insulation layer as an air gap, a dielectric cap layer 352 is formed over the upper surface of the PCM cell and sidewalls of the thermal insulation layer (308 in FIG. 3A); in this embodiment, the thermal insulation layer merely serves as a dummy layer. A selective etch is then performed to remove the dummy layer, leaving an air gap 354 acting as a thermal insulation layer. The resulting PCM structure 350 is shown in FIG. 3C after removal of the dummy layer (308 in FIG. 3A).

Figure 4A:
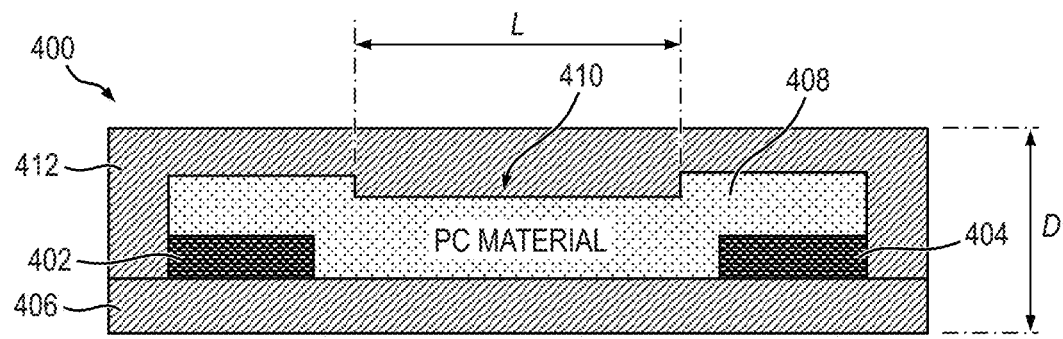
FIGS. 4A and 4B are cross-sectional and top views, respectively, depicting an exemplary lateral PCM cell, according to an embodiment of the present invention.
Figure 4B:
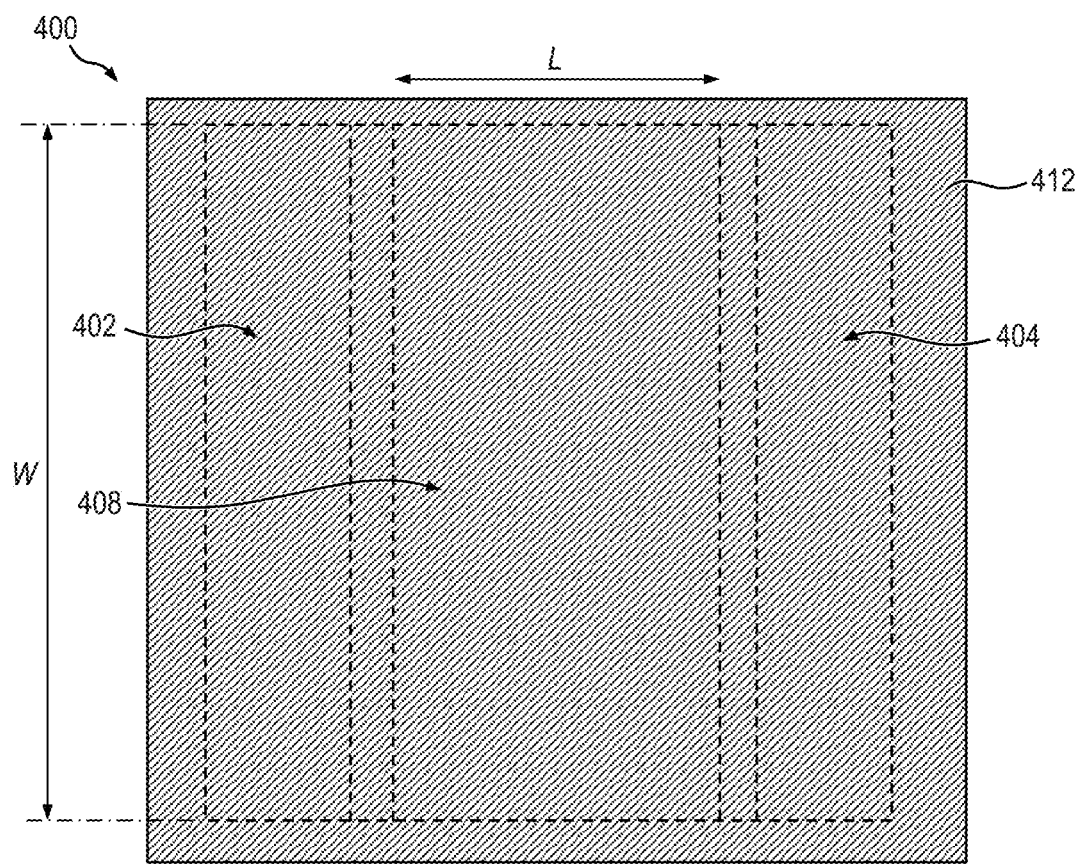

By way of example only and without limitation, FIGS. 4A and 4B are cross-sectional and top views, respectively, depicting an exemplary lateral PCM structure or cell 400, according to another embodiment of the invention. In this illustrative embodiment, the PCM cell 400 is configured having a flat, rectangular form factor. More particularly, the PCM cell 400 includes a first electrode 402 and a second electrode 404 disposed on an upper surface of a dielectric substrate 406. Unlike the first and second electrodes 302, 304 in the illustrative PCM cell 300 shown in FIGS. 3A and 3B, the first and second electrodes 402, 404 are laterally separated and are substantially in a same plane relative to one another.

The PCM cell 400 further includes a PC material layer 408 disposed on a portion of the substrate 406 between the first and second electrodes 402, 404 and disposed on at least a portion of an upper surface of first and second electrodes. The first and second electrodes 402, 404 and PC material layer 408 can be formed, in one or more embodiments, using a standard deposition process, as will be known by those skilled in the art.

In one or more embodiments, a portion of an upper surface of the PC material layer 408 includes a trench or channel 410 formed therein, so that the upper surface of the PC material layer has a stepped, rather than a planar, profile. A thermal insulation layer 412 is then formed on the PCM cell 400, including on the upper surface of the PC material layer 408, on sidewalls of the first and second electrodes 402, 404 and PCM layer, and on a portion of the substrate 406. In this manner, the thermal insulation layer 412 essentially encapsulates the PC material layer 408, in one or more embodiments. The PCM cell 400, or at least a portion thereof, may be formed during back-end-of-line (BEOL) processing.

As shown in FIG. 4B, a width, W, of the exemplary PCM cell 400 is preferably much greater than a length, L, of the PCM cell. In one or more embodiments, the PCM cell 400 is configured having a length in a range from about 5 nm to about 50 nm, and having a width in a range from about 100 nm to about 1 µm, so that a ratio of width-to-length of the PCM cell 400 is about 20:1. With reference to FIG. 4A, a thickness, D, of the combined thermal insulation layer 412 and substrate 406, in one or more embodiments, is in a range from about 30 nm to about 300 nm and is not a critical dimension. A cross-sectional thickness of the PC material layer 408, in one or more embodiments, is in a range from about 20 nm to about 200 nm; a thickness of the PC material layer 408 may be selected based at least in part on resistance and/or power switching requirements of the PCM cell 400. It is to be appreciated, however, that embodiments of the invention are generally not limited to any specific dimensions of the PCM cell 400.

Consistent with the PCM cell 300 shown in FIGS. 3A and 3B, the material used to form the first and second electrodes 402, 404, in one or more embodiments, comprises a material having high thermal resistance, such as, but not limited to, silicon, germanium, carbon, tungsten, Manganin (an alloy containing copper, manganese and nickel), etc., although embodiments of the invention are not limited to any specific material(s) for forming the bottom and top electrodes. In one or more embodiments, a thermal conductance of the first and second electrodes 402, 404 is preferably less than about 100 W/m·K. Moreover, the first and second electrodes 402, 404 need not be formed of the same material. Each of the substrate 406 and thermal insulation layer 412 preferably comprises a material having sufficient thermal insulation properties. In one or more embodiments, each of the substrate 406 and thermal insulation layer 412 comprises a material having a thermal conductivity of less than about 0.1 W/m·K, such as, for example, porous oxides (e.g., silicon dioxide). In one or more embodiments, the substrate 406 and thermal insulation layer 412 are formed of the same material, although in other embodiments the substrate and thermal insulation layer are formed of different materials.

Figure 4C:
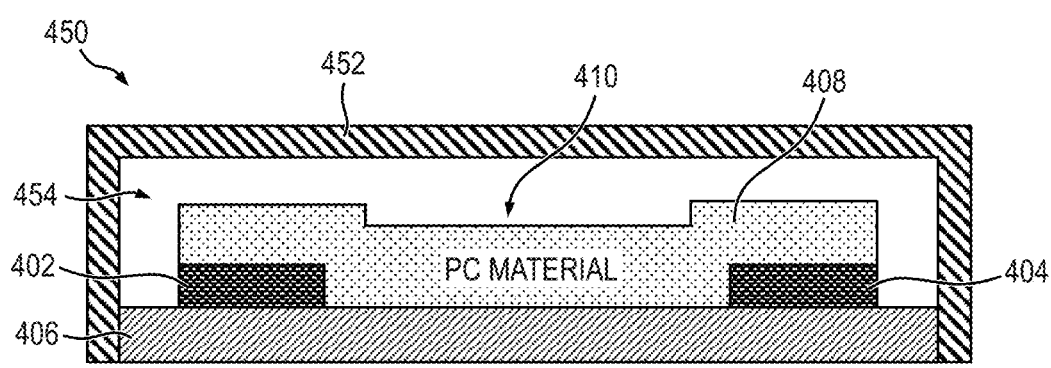
FIG. 4C is a cross-sectional view depicting at least a portion of an exemplary lateral PCM cell having an air gap as a thermal insulation layer, according to another embodiment of the present invention.

Alternatively, in a manner consistent with the illustrative vertical PCM cell 350 shown in FIG. 3C, the thermal insulation layer 412 may be formed as an air gap, since the properties of air are favorable for use as a thermal insulator. With reference to FIG. 4C, an illustrative lateral PCM cell 450 is depicted that utilizes an air gap for the thermal insulation layer, in accordance with another embodiment of the invention. In this embodiment, the thermal insulation layer (412 in FIG. 4A) merely serves as a dummy layer. A dielectric cap layer 452 is formed over the upper surface and sidewalls of the thermal insulation layer (412 in FIG. 4A) so as to encapsulate the thermal insulation layer. Then, a selective undercut etch is performed to remove the thermal insulation layer, leaving an air gap 454 which serves as the thermal insulation layer. The resulting PCM structure 450 is shown in FIG. 4C after removal of the dummy layer (412 in FIG. 4A).

In one or more embodiments, with reference to FIG. 4A, when a bias signal (e.g., bias voltage) is applied between the first and second electrodes 402, 404, a current will flow through the PC material layer 408, from the electrode having a higher voltage potential to the electrode having a lower voltage potential, relative to one another. This current flowing through the PC material layer 408 will cause local heating to occur in a portion of the PC material layer. When the temperature of the phase change material reaches a prescribed threshold level (melting temperature $T_M$), a change of state of the phase change material will occur, as previously explained. Since the electrodes 402, 404 are arranged in the same plane (i.e., side-by-side) relative to one another, the induced current will flow laterally (i.e., horizontally) through the PC material layer 408. Thus, the PCM cell 400 may be referred to herein as a lateral PCM device.

Figure 5:
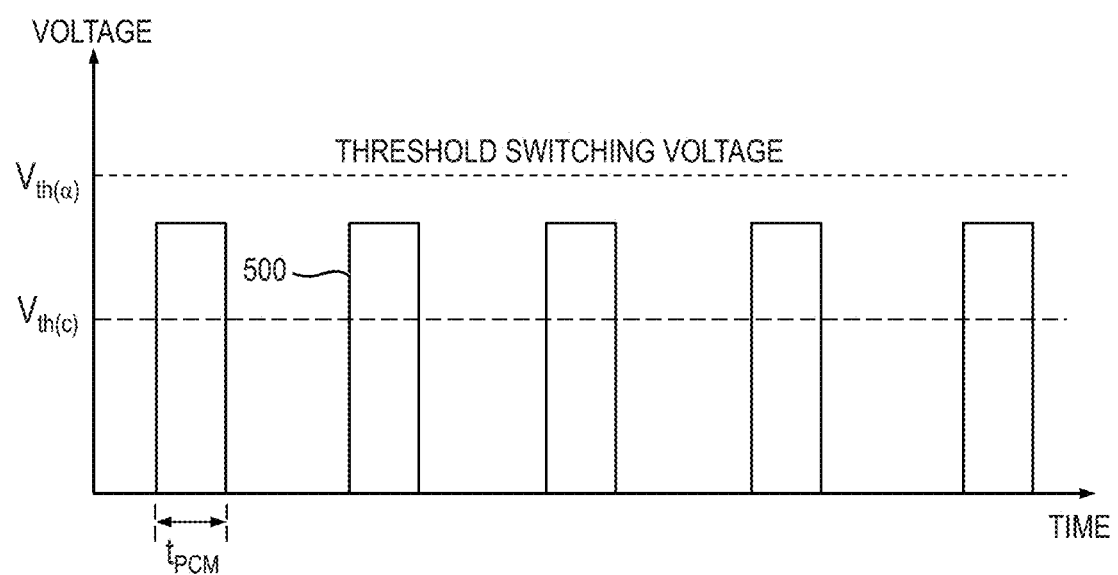
FIG. 5 graphically depicts an exemplary reset signal that can be applied to the PCM cells shown in FIGS. 3A-3C and 4A-4C for performing a gradual reset operation, according to an embodiment of the present invention.

FIG. 5 graphically depicts an exemplary reset signal 500 that can be applied to the PCM cells 300 and 400 shown in FIGS. 3A-3B and 4A-4B, respectively, for performing a gradual reset operation, according to an embodiment of the invention. As apparent from FIG. 5, the reset signal 500, in this illustration, comprises a series of pulses, with each pulse having an amplitude that is less than a threshold switching voltage of the amorphous phase change material, $V_{th(\alpha)}$, so that no significant current passes through the phase change material that has already been amorphized. Recall that the amorphous phase of the phase change material has a much higher electrical resistance compared to the resistance of the crystalline phase of the phase change material, and thus the current will tend to favor a path of least resistance through the crystalline phase change material. Preferably, each pulse has a duration (i.e., pulse width), $t_{PCM}$, that is configured such that it is sufficiently long enough to raise a temperature in the crystalline phase change material to melt the material. That is, the applied reset signal 500, in one or more embodiments, is configured having a voltage amplitude that is greater than the crystalline phase change material switching threshold voltage, $V_{th(c)}$, but is less than the amorphous phase change material switching threshold voltage $V_{th(\alpha)}$.

By way of example only, in one or more embodiments, an amplitude of each of the pulses in the reset signal 500 is about 1.5 volts (V) to about 3.5 V, and a pulse width or duration of each pulse is about 10 ns to about 50 ns. It is to be appreciated, however, that embodiments of the invention are not limited to any specific pulse amplitude or duration.

During a gradual reset operation in a PCM cell according to one or more embodiments of the invention, only a center portion of the phase change material is amorphized by a first reset pulse. A second reset pulse is configured so that a temperature of the phase change material will not exceed the amorphized region switching threshold voltage so that the current in this center amorphized region will be low. Consequently, the center region of the PC material layer will not be appreciably heated and will thus remain in its amorphous state. Instead, most of the reset current will flow around the center amorphized region and will heat up a region of the phase change material immediately adjacent to and surrounding the center amorphized region; and so on for subsequent reset pulses. In this manner, the phase change material surrounding the center region will be amorphized, layer by layer, with each successive reset pulse.

Figure 6A:
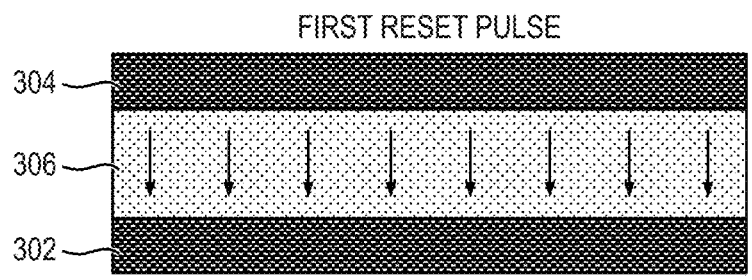
FIGS. 6A-6C conceptually depict an exemplary amorphizing of phase change material in the exemplary vertical PCM cell of FIG. 3A resulting from an applied first reset pulse during a gradual reset operation, according to an embodiment of the present invention.
Figure 6B:
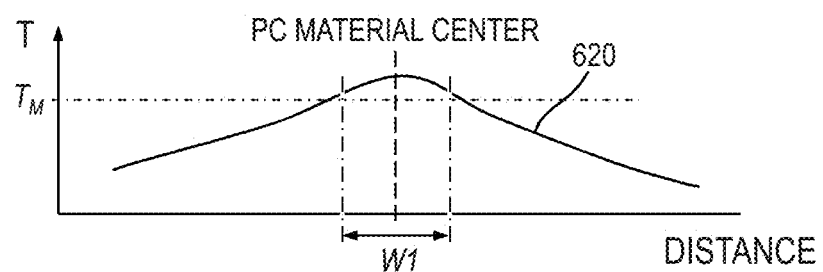
Figure 6C:
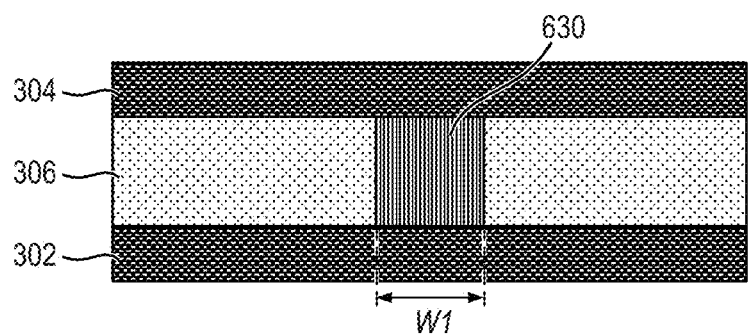

More particularly, FIGS. 6A-6C conceptually depict an exemplary amorphizing of phase change material in a PCM cell (e.g., 300 or 400 in FIG. 3A or 4A, respectively) resulting from an applied first reset pulse during a gradual reset operation, according to an embodiment of the invention. With reference to FIG. 6A, the exemplary vertical PCM cell 300 of FIG. 3 is shown in its crystalline phase. When a first reset pulse having an amplitude, V, that is greater than the crystalline phase change material switching threshold voltage but less than the amorphous phase change material switching threshold voltage $V_{th(\alpha)}$ (i.e., $V_{th(c)} < V < V_{th(\alpha)}$) is applied between the top electrode 304 and bottom electrode 302, a current (represented by the arrows in FIG. 6A) will flow throughout the PC material layer 306 in a substantially uniform manner. FIG. 6B depicts an exemplary temperature profile 620 of the phase change material as a function of distance in the PC material layer 306. As apparent from FIG. 6B, the current flowing through the PC material layer 306 will cause a temperature of the phase change material to rise until the temperature in a center portion of the phase change material exceeds a phase change material melting temperature, $T_M$. This results in a center portion 630 of the PC material layer 306 switching to its high-resistance amorphous state, as shown in FIG. 6C. A width of this amorphous portion of the PC material layer 306 is labelled W1 in FIGS. 6B and 6C.

Figure 7A:
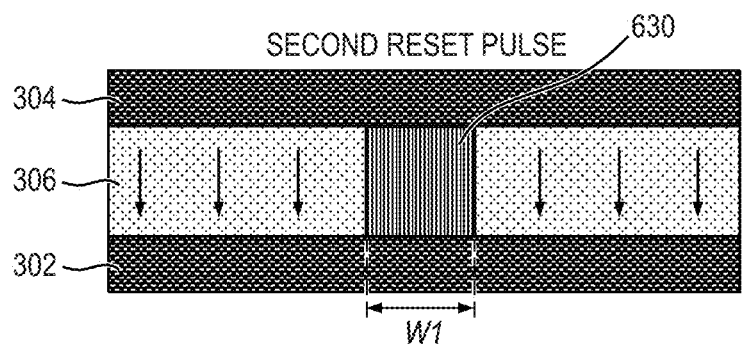
FIGS. 7A-7C conceptually depict an exemplary amorphizing of phase change material in the exemplary vertical PCM cell of FIG. 6C resulting from an applied second reset pulse during a gradual reset operation, according to an embodiment of the present invention.
Figure 7B:
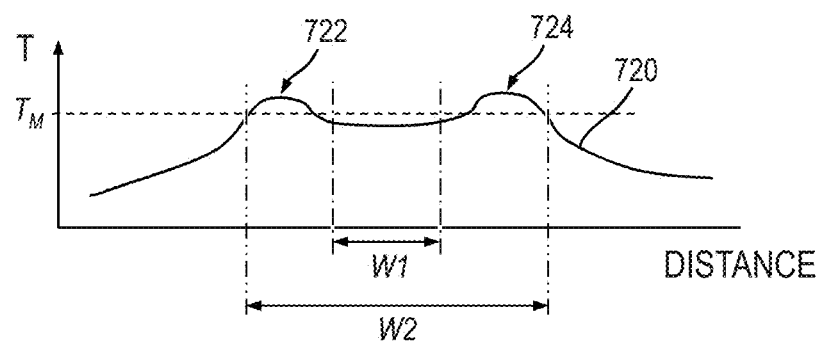
Figure 7C:
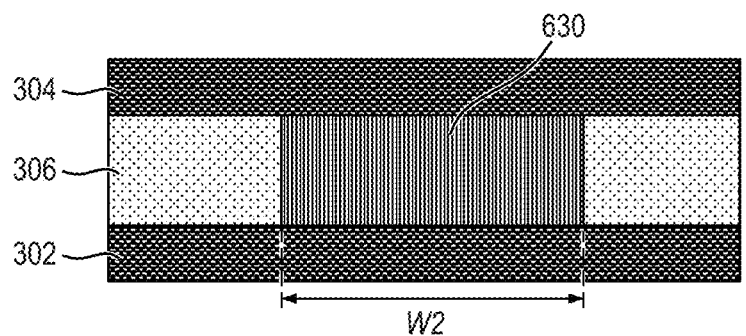

Similarly, FIGS. 7A-7C conceptually depict an exemplary amorphizing of phase change material in the PCM cell (e.g., 300 or 400 in FIG. 3A or 4A, respectively) resulting from an applied second reset pulse during a gradual reset operation, according to an embodiment of the invention. With reference to FIG. 7A, the exemplary vertical PCM cell of FIG. 6C is shown with the PC material layer 306 including an amphorized center portion 630 of width W1 after the first reset pulse was applied. When a second reset pulse having the same characteristics as the first reset pulse, at least in terms of amplitude V ($V_{th(c)} < V < V_{th(\alpha)}$) and duration, is applied between the top electrode 304 and bottom electrode 302, a current (represented by the arrows shown in FIG. 7A) will flow primarily through the low-resistance crystalline portion of the PC material layer 306, and substantially no current will flow through the high-resistance amorphous portion 630. FIG. 7B depicts an exemplary temperature profile 720 of the phase change material as a function of distance in the PC material layer 306. As apparent from FIG. 7B, the current flowing through the PC material layer 306 will cause a temperature of the phase change material to rise until the temperature of the phase change material (portions 722 and 724 of the temperature profile 720) adjacent to the center amorphized portion 630 exceeds the phase change material melting temperature $T_M$. Additionally, the temperature of the center amorphized portion 630 will remain below the critical melting temperature, and thus the center amorphized portion will not return to its crystalline state. This results in portions (722 and 724) of the phase change material adjacent to the center portion 630 becoming amorphized such that a width of the amorphized portion 630 in the PC material layer 306 will increase to W2 (W2>W1), as shown in FIG. 7C. This process can be repeated until essentially all of the phase change material comprised in the PC material layer 306 has been amorphized.

Figure 8:
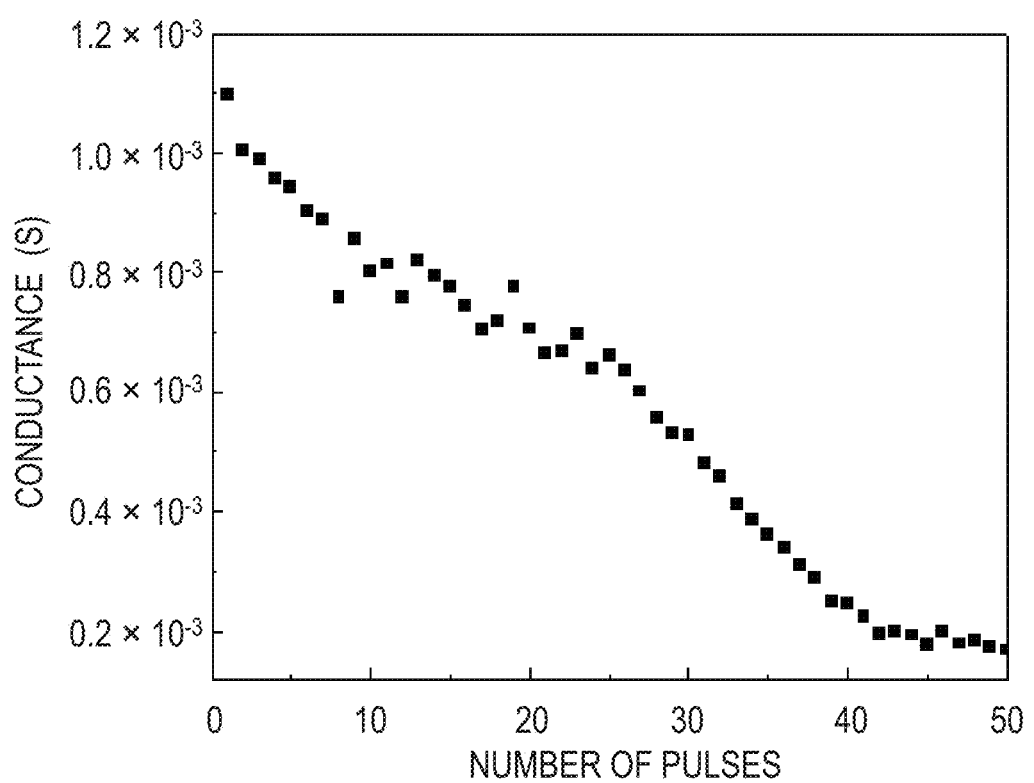
FIG. 8 graphically depicts a plot of PCM cell conductance as a function of the number of applied reset pulses, according to an embodiment of the present invention.

FIG. 8 graphically depicts a plot 800 of PCM cell conductance as a function of the number of applied reset pulses, according to an embodiment of the present invention. As apparent from FIG. 8, the electrical conductance, in units of Siemens (S), of the PCM cell according to one or more embodiments of the invention decreases substantially linearly with the number of successive reset pulses, thereby providing a gradual reset operation in the PCM cell. Each successive reset pulse will have a corresponding distinguishable resistance value that can be measured (e.g., by a sense amplifier or the like). In this manner, a PCM cell according to embodiments of the invention functions as an analog memory device.

At least a portion of the structures and fabrication methods of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having PCM devices therein formed in accordance with one or more embodiments of the invention.

An integrated circuit in accordance with aspects of the present disclosure can be employed in essentially any application and/or electronic system involving PCM, such as, but not limited to, a memory array, neural network, etc. Suitable systems for implementing embodiments of the invention may include, but are not limited to, computing systems. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the structures and semiconductor fabrication methodologies described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above," "below," "upper," "lower," "top" and "bottom" which may be used throughout the present disclosure are intended to indicate the positioning of elements or structures relative to each other rather than absolute orientation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A phase change memory (PCM) structure configured for performing a gradual reset operation, the PCM structure comprising:
   first and second electrodes;
   a phase change material layer disposed between the first and second electrodes, wherein a first outermost sidewall of the phase change material layer is vertically aligned to an outermost sidewall of the first electrode and a second outermost sidewall of the phase change material layer is vertically aligned to an outermost sidewall of the second electrode;
   a thermal insulation layer disposed on at least the outermost sidewalls of the first and second electrodes and the first and second outermost sidewalls of the phase change material layer, the thermal insulation layer being configured to provide non-uniform heating of the phase change material layer;
   a dielectric material substrate having a topmost surface, wherein each of the first electrode, the second electrode, the phase change material layer, and the thermal insulation layer is located entirely above the topmost surface of the dielectric material substrate; and
   a dielectric capping layer located around the thermal insulation layer and along outermost sidewalls of the dielectric material substrate, wherein the first and second electrodes are in direct physical contact with the topmost surface of the dielectric material substrate and spaced laterally from one another, the phase change material layer is in direct physical contact with the topmost surface of the dielectric material substrate between the first and second electrodes and with an upper surface of the first and second electrodes, and the thermal insulation layer is in direct physical contact with the topmost surface of the dielectric material substrate and with an upper surface of the phase change material layer to thereby encapsulate the first and second electrodes and the phase change material layer.

2. The PCM structure of claim 1, wherein at least one of the first and second electrodes comprises a material having a thermal conductance of less than about 100 watts per meter-kelvin.

3. The PCM structure of claim 1, wherein the thermal insulation layer comprises a material having a thermal conductivity of less than about 0.1 watts per meter-kelvin.

4. The PCM structure of claim 1, wherein the PCM structure has a substantially rectangular form factor.

5. The PCM structure of claim 1, further comprising a channel formed in the upper surface of the phase change material layer between the first and second electrodes.

6. The PCM structure of claim 5, wherein the upper surface of the phase change material layer has a stepped profile.

7. The PCM structure of claim 1, wherein the PCM structure is configured to have a length in a range from about 5 nm to about 50 nm, and have a width in a range from about 100 nm to about 1 μm, wherein a ratio of width-to-length of the PCM structure is about 20:1.

8. The PCM structure of claim 1, wherein a thickness of a combined thermal insulation layer and the dielectric material substrate is in a range from about 30 nm to about 300 nm.

9. The PCM structure of claim 1, wherein a cross-sectional thickness of the phase change material layer is in a range from about 20 nm to about 200 nm.

10. The PCM structure of claim 1, wherein a thickness of the phase change material layer is selected based at least in part on at least one of resistance and power switching requirments of the PCM structure.

11. The PCM structure of claim 1, wherein the first and second electrodes are laterally separated and are substantially in a same plane relative to one another.

12. The PCM structure of claim 1, responsive to a bias signal being applied between the first and second electrodes, an induced current flows laterally through the phase change material layer.

13. The PCM structure of claim 1, wherein the dielectric material substrate comprises a material having a thermal conductivity of less than about 0.1 watts per meter-kelvin.

14. The PCM structure of claim 1, wherein the dielectric material substrate and the thermal insulation layer are formed of different materials.

15. The PCM structure of claim 1, wherein the thermal insulation layer is formed as an air gap.

16. The PCM structure of claim 1, wherein applying a first reset pulse between the first and second electrodes, the first reset pulse having an amplitude that is greater than a crystalline phase change material switching threshold voltage and less than an amorphous phase change material switching threshold voltage, for a prescribed duration causes a temperature of the phase change material layer to rise until a temperature in a center portion of the phase change material layer exceeds a phase change material melting temperature, wherein the center portion of the phase change material layer switches to a high-resistance amorphous state, wherein applying at least one subsequent reset pulse between the first and second electrodes, the at least one subsequent reset pulse having an amplitude and duration that is the same as the first reset pulse, causes a temperature of the phase change material layer to rise until a temperature in a portion of the phase change material layer adjacent to the center portion exceeds the phase change material melting temperature, wherein the portion of the phase change material layer adjacent to the center portion switches to the high-resistance amorphous state while the center portion of the phase change material layer remains in the high-resistance amorphous state.

\* \* \* \* \*